(12) United States Patent
Koike

(10) Patent No.: US 6,392,300 B1
(45) Date of Patent: May 21, 2002

(54) SEMICONDUCTOR DEVICE HAVING AN ALIGNMENT MARK FORMED ON THE UPPERMOST LAYER OF A MULTILAYER WIRE

(75) Inventor: Hidetoshi Koike, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 1 day.

(21) Appl. No.: 09/604,791

(22) Filed: Jun. 28, 2000

(30) Foreign Application Priority Data

Jun. 28, 1999 (JP) ............................................ 11-181878

(51) Int. Cl.[7] .............................................. H01L 23/48
(52) U.S. Cl. ........................ 257/758; 257/752; 257/795; 257/758; 257/734
(58) Field of Search .................................. 257/752, 797, 257/620, 758, 734, 744, 743, 745; 438/612, 611, 597, 613, 622, 637, 666, 700, 692, 633, 697, 724, 401

(56) References Cited

U.S. PATENT DOCUMENTS

| | | | |
|---|---|---|---|
| 5,783,490 A | | 7/1998 | Tseng |
| 5,866,920 A | * | 2/1999 | Matsumoto et al. .......... 257/63 |
| 5,933,744 A | * | 8/1999 | Chen et al. ................. 438/401 |
| 5,939,789 A | * | 8/1999 | Kawai et al. ................ 257/758 |
| 5,976,971 A | * | 11/1999 | Kinpara et al. ............. 438/637 |

* cited by examiner

*Primary Examiner*—Matthew Smith
*Assistant Examiner*—V. Yevsikov
(74) *Attorney, Agent, or Firm*—Pillsbury Winthrop LLP

(57) ABSTRACT

A semiconductor device having a multilayer wire in which a plurality of wires are formed on a semiconductor substrate in layers with insulating films interposed therebetween. An alignment mark made of a conductive material is formed in a layer including an uppermost wire of the multilayer wire. A conductive plug is buried in a contact hole formed in one of the insulating films under the alignment mark. The conductive plug is in contact with the alignment mark.

17 Claims, 5 Drawing Sheets

SEMICONDUCTOR DEVICE HAVING AN ALIGNMENT MARK FORMED ON THE UPPERMOST LAYER OF A MULTILAYER WIRE

CROSS-REFERENCE TO RELATED APPLICATIONS

This application is based upon and claims the benefit of priority from the prior Japanese Patent Application No. 11-181878, filed Jun. 28, 1999, the entire contents of which are incorporated herein by reference.

BACKGROUND OF THE INVENTION

The present invention relates to a semiconductor device, and particularly to a semiconductor device having an alignment mark formed on the uppermost layer of a multilayer wire.

As the density of a semiconductor memory and a capacity thereof have been increased, the memory chip as a whole cannot be completely defect-free. Therefore, it is common knowledge to use a redundancy structure incorporating a defect relief circuit in a memory LSI and an LSI on which a memory and a logic circuit are mixed.

When a defective cell is replaced by a spare cell, first, in general, the address of the defective cell is stored in a memory, thereafter a fuse constituted of a wiring layer made of polysilicon or aluminum is blown by a laser, and a spare cell to be used in place of the defective cell is selected. To blow the fuse, an alignment mark for positioning the laser is formed of the uppermost metal wire layer.

FIGS. 1 to 9 are cross-sectional views showing a conventional process for manufacturing an LSI having a four-layer metal wiring structure in which alignment marks are formed.

First, as shown in FIG. 1, an element isolating region 13 is formed in a silicon substrate 11. Then, a passive element (e.g., a resistor) and an active element (e.g., a MOSFET), made of a diffusion layer 14, are formed in a region other than the element isolating region 13. A reference numeral 15 denotes a gate electrode of the MOSFET. An inter-chip region 12 later serves as a dicing line. The aforementioned alignment marks are located above the dicing line region 12.

Then, as shown in FIG. 2, a first interlayer insulating film 16 made of BPSG film is deposited on the substrate, and flattened by means of CMP (chemical mechanical polishing). Thereafter, a first contact hole is opened by photolithography. The first contact hole is filled with first tungsten 17 by CVD (chemical vapor deposition). Further, a first aluminum layer 18 is deposited on the overall surface of the structure. The first aluminum layer 18 is patterned into a predetermined shape by photolithography.

Subsequently, as shown in FIG. 3, a second interlayer insulating film 19 made of $SiO_2$ is deposited, and flattened by CMP. Then, a second contact hole is opened by photolithography. The second contact hole is filled with second tungsten 20 by CVD. Further, a second aluminum layer 21 is deposited on the overall surface of the structure. The second aluminum layer 21 is patterned into a predetermined shape by photolithography.

Subsequently, as shown in FIG. 4, a third interlayer insulating film 22 made of $SiO_2$ is deposited, and flattened by CMP. Then, a third contact hole is opened by photolithography. The third contact hole is filled with third tungsten 23 by CVD. Further, a third aluminum layer 24 is deposited on the overall surface of the structure. The third aluminum layer 24 is patterned into a predetermined shape by photolithography.

Thereafter, as shown in FIG. 5, a fourth interlayer insulating film 25 made of $SiO_2$ is deposited, and flattened by CMP. Then, a fourth contact hole is opened by photolithography. The fourth contact hole is filled with fourth tungsten 26 by CVD. Further, a fourth aluminum layer is deposited on the overall surface of the structure. The fourth aluminum layer is patterned into a predetermined shape by photolithography. As a result, a metal fuse (not shown) or a bonding pad 27B is formed from a part of the fourth aluminum layer. An alignment mark 27A is also formed from a part of the fourth aluminum layer.

Then, as shown in FIG. 6, a passivation film 28 made of $Si_3N_4$ is deposited. A part of the passivation film 28 on the bonding pad 27B is etched by photolithography, thereby forming an opening through which the bonding pad 27B is exposed. At this time, a part of the passivation film 28 on the alignment mark is also etched to prevent cracking. As a result of this etching process, the alignment mark 27A is exposed and a part of the fourth interlayer insulating film 25 around the alignment mark 27A is over-etched.

In the pad opening step as described above, when the alignment mark 27A is exposed and the part of the fourth interlayer insulating film 25 around the alignment mark 27A is over-etched, the alignment mark 27A may probably be removed in subsequent steps, as shown in FIG. 7. If the alignment mark 27A is removed, fuse-blow cannot be performed, since the alignment mark 27A, for use in positioning the laser when the fuse is blown, cannot be detected.

Further, if a bump (electrode) forming step is performed after the step shown in FIG. 6, another problem may arise, which will be described below with reference to FIGS. 8 and 9.

After the step shown in FIG. 6, a barrier metal 30 made of a Ti/Ni/Pd laminated film is deposited, as shown in FIG. 8. Further, photoresist 31 is applied to the overall surface, and thereafter opened to expose that portion of the barrier metal 30 on the bonding pad 27B on which a bump is to be formed. Then, an Au bump 32 is grown on the portion of the barrier metal 30 on the bonding pad 27B by electrolytic plating or the like.

Thereafter, as shown in FIG. 9, the photoresist 31 is removed. Then, the barrier metal 30 exposed on the passivation film 28 is removed by a solution of aqua regia, ethylene-diamine-tetraacetic acid, or the like. The Au bump 32 is maintained.

Since the alignment mark 27A made of only the fourth aluminum layer is electrically floating, it is generally charged up in the electrolytic plating step or the like. In this case, when the barrier metal 30 is removed by the aforementioned solution of aqua regia or ethylene-diamine-tetraacetic acid, the alignment mark 27A (aluminum) under the barrier metal 30 is also undesirably etched. As a result, the alignment mark 27A is etched as if it were a corroded alignment mark 33. When fuse-blow is to be performed, the alignment mark 33 in the corroded state cannot be detected. In this case, since the alignment mark 33 for positioning the laser cannot be detected, fuse-blow cannot be performed.

As described above, in the conventional semiconductor device, the alignment mark 27A is exposed in the pad opening step and the insulating film around the alignment mark 27A is inevitably over-etched in the pad opening step. Therefore, the alignment mark may be easily removed in the subsequent steps. If the alignment mark is removed, when fuse-blow is to be performed, a problem arises, that is, the alignment mark for positioning the laser cannot be detected, and fuse-blow cannot be performed.

Further, in the bump forming step, when barrier metal exposed in a region other than the bump electrode portion is removed by a solution, the alignment mark under the barrier metal is etched as if it were corroded. Therefore, when fuse-blow is to be performed, a problem arises, that is, the alignment mark cannot be detected and fuse-blow cannot be performed.

BRIEF SUMMARY OF THE INVENTION

The present invention was made to solve the above problems. It is accordingly an object of the present invention to provide a semiconductor device, even if an alignment mark is exposed and an insulating film around the alignment mark is over-etched in a pad opening step, which semiconductor device can prevent the alignment mark from being removed in the subsequent steps and can detect the alignment mark in fuse-blow.

Another object of the present invention is to provide a semiconductor device, which can prevent an alignment mark under a barrier metal from being etched, when the barrier metal exposed in a region other than a bump electrode region is removed by a solution, and which can detect the alignment mark in fuse-blow.

To achieve the above object, a semiconductor device according to a first aspect of the present invention comprises: a semiconductor substrate; an insulating film formed on the semiconductor substrate; a conductive plug buried in a contact hole formed in the insulating film; and an alignment mark made of conductive material formed on the insulating film including the conductive plug so as to be in contact with the conductive plug.

The above semiconductor device has a structure in which the conductive alignment mark is in contact with the conductive plug buried in the contact hole in the underlying layer. Since the adhesion between the conductive alignment mark and the conductive plug buried in the contact hole is firm, the alignment mark is not removed in the subsequent steps.

To achieve the above object, a semiconductor device according to a second aspect of the present invention, having a multilayer wire in which a plurality of wires are formed on a semiconductor substrate in layers with insulating films interposed therebetween, comprises: an alignment mark made of a conductive material and formed in a layer including an uppermost wire of the multilayer wire; and a conductive plug buried in a contact hole formed in one of the insulating films under the alignment mark, the conductive plug being in contact with the alignment mark.

The above semiconductor device has a structure in which the conductive alignment mark is in contact with the conductive plug buried in the contact hole in the underlying layer. Since the adhesion between the conductive alignment mark and the conductive plug buried in the contact hole is firm, the alignment mark is not removed in the subsequent steps.

To achieve the above object, a semiconductor device according to a third aspect of the present invention, having a multilayer wire in which a plurality of wires are formed on a semiconductor substrate in layers with insulating films interposed therebetween, comprises: an alignment mark made of a conductive material and formed in a layer including an uppermost wire of the multilayer wire; a plurality of conductive patterns formed in layers other than the layer including the uppermost wire of the multilayer wire; and a plurality of conductive plugs, respectively buried in contact holes formed in the insulating films under the alignment mark, a conductive plug buried in a contact hole formed in an insulating film immediately under the alignment mark being in contact with the alignment mark, the alignment mark being electrically connected to the semiconductor substrate through the plurality of conductive plugs and the plurality of conductive patterns.

The above semiconductor device has a structure in which the conductive alignment mark is in contact with the conductive plug buried in the contact hole in the underlying layer. Since the adhesion between the conductive alignment mark and the conductive plug buried in the contact hole is firm, the alignment mark is not removed in the subsequent steps.

Further, the alignment mark is electrically connected to the semiconductor substrate through the conductive plugs buried in the contact holes in the underlying layers and the conductive patterns in the underlying layers. With this structure, since the alignment mark can be prevented from being charged up, it is possible to prevent the problem in the manufacturing process in which the alignment mark is etched as if it were corroded due to the charge-up.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings.

First Embodiment

A method for manufacturing a semiconductor device according to a first embodiment of the present invention will be described first.

FIGS. 10 to 15 are cross-sectional views showing a semiconductor device (LSI) having an alignment mark according to the first embodiment. The semiconductor device has a four-layer metal wiring structure.

Figure 1:
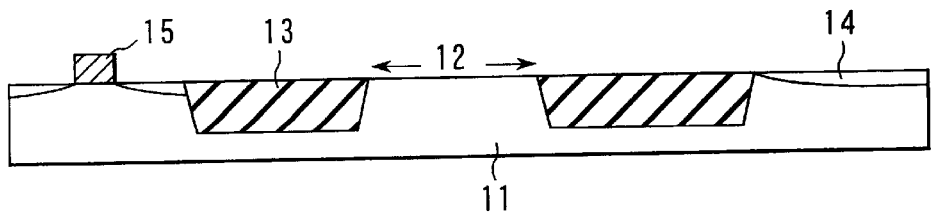
FIGS. 1 to 9 are cross-sectional views showing a process for manufacturing a conventional semiconductor device.
Figure 2:
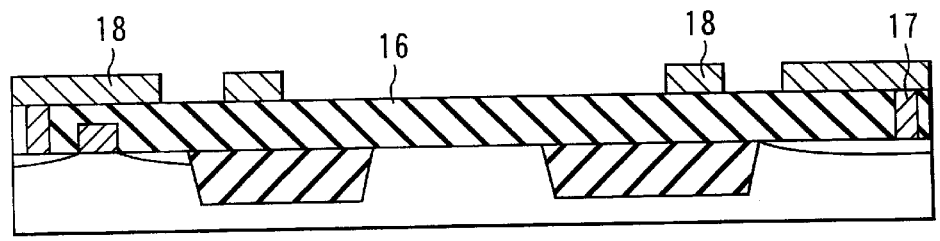
Figure 3:
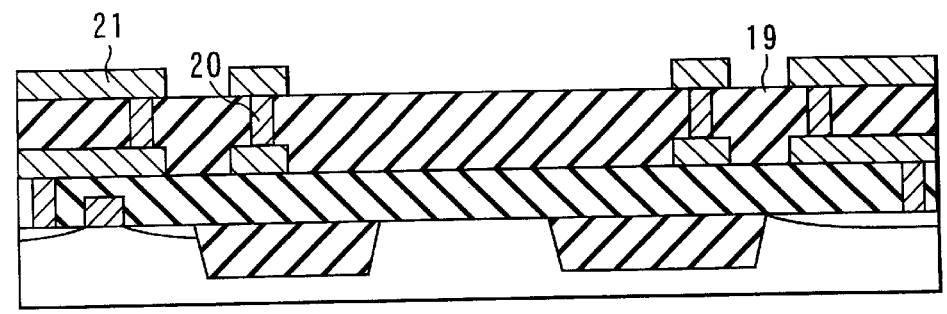
Figure 4:
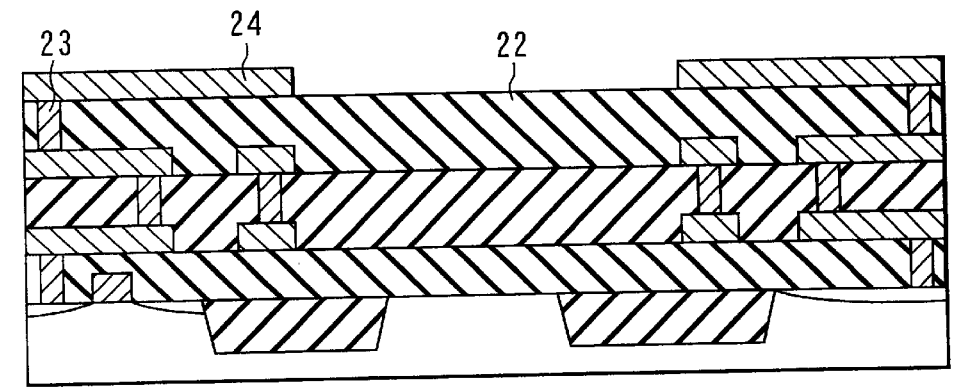
Figure 5:
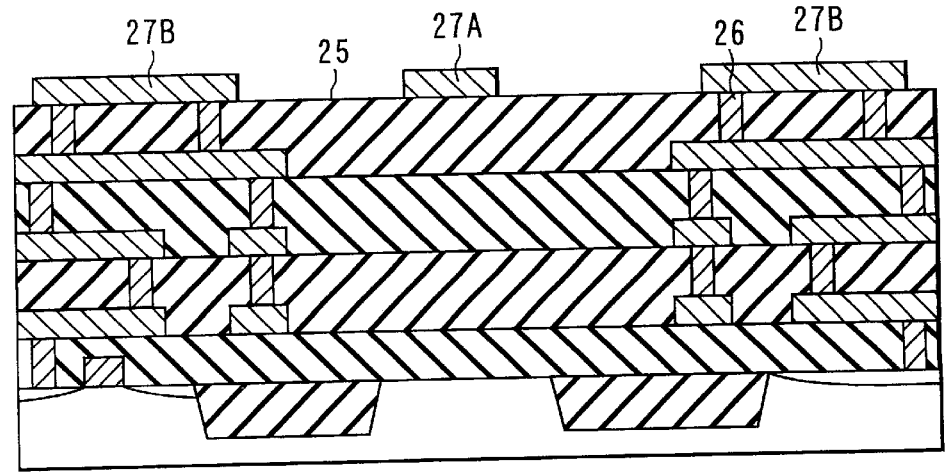
Figure 6:
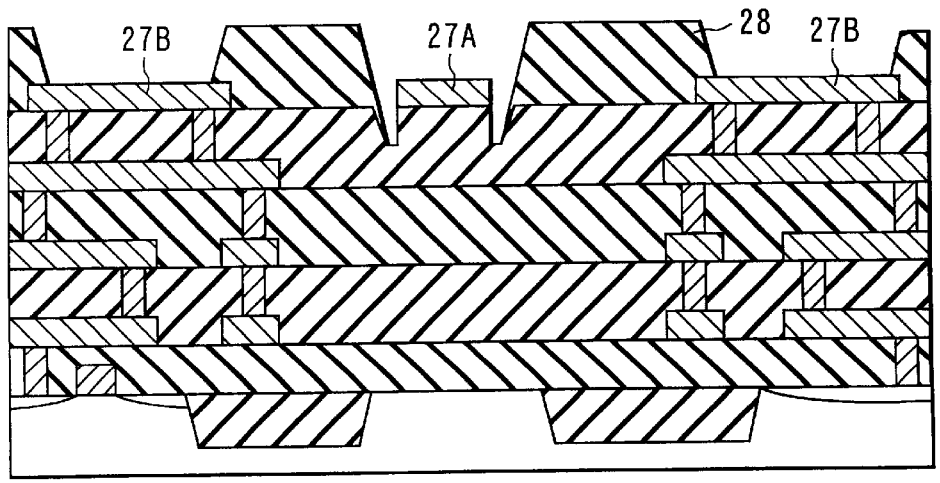
Figure 7:
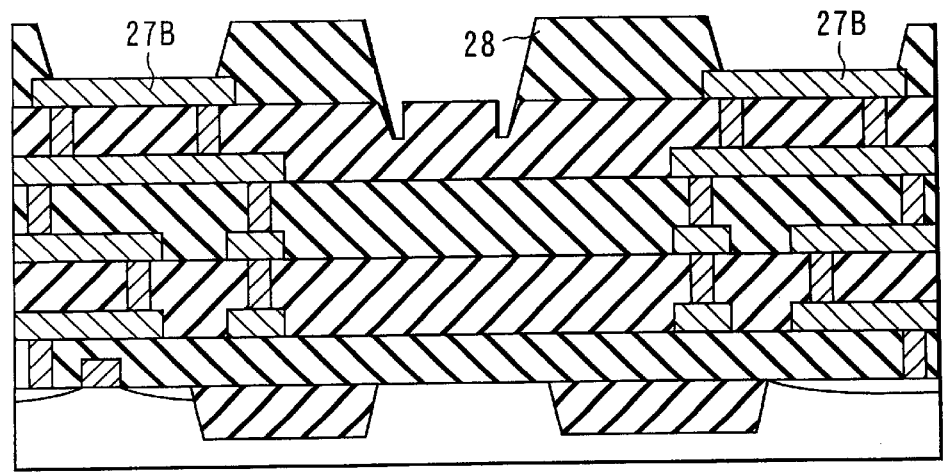
Figure 8:
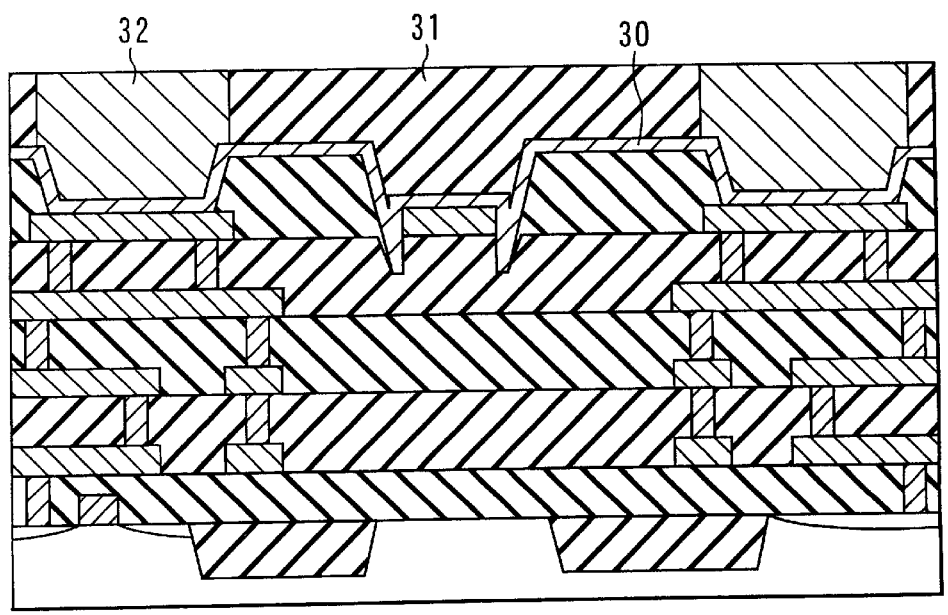
Figure 9:
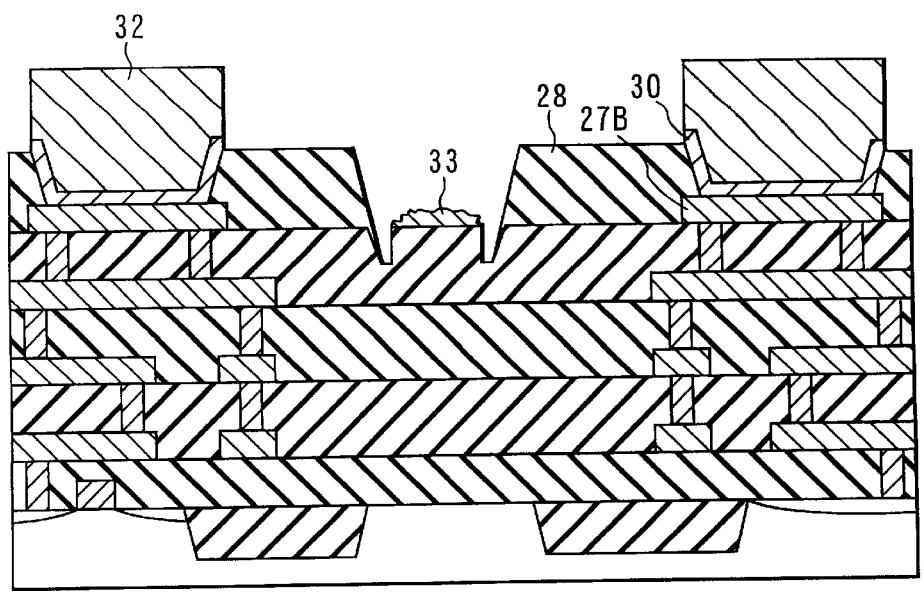
Figure 10:
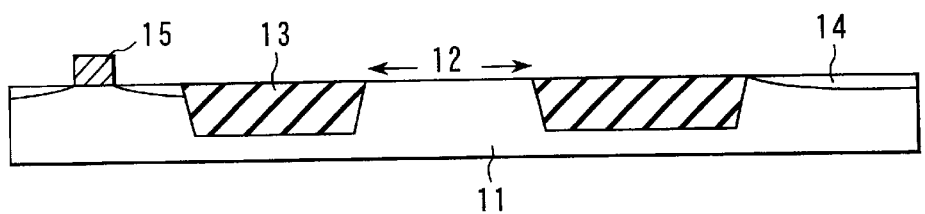
FIGS. 10 to 14 are cross-sectional views showing a process for manufacturing a semiconductor device according to a first embodiment of the present invention.

First, as shown in FIG. 10, an element isolating region 13 is formed on a silicon substrate 11. Then, a passive element (e.g., a resistor) and an active element (e.g., a MOSFET), made of a diffusion layer 14, are formed in a region other than the element isolating region 13. A reference numeral 15 denotes a gate electrode of the MOSFET. An inter-chip region 12 serves as a dicing line later. Various alignment marks are formed above the dicing line region 12.

Figure 11:
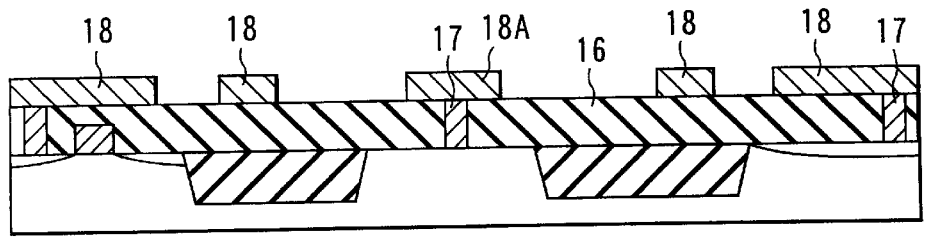

Then, as shown in FIG. 11, a first interlayer insulating film 16 made of BPSG film is deposited on the substrate, and flattened by means of CMP (chemical mechanical polishing). The thickness of the flattened first interlayer insulating film 16 is, for example, about 7000 Å. Thereafter, a first contact hole is formed in a portion of the first interlayer insulating film 16, corresponding to the diffusion layer 14 or the source or drain region of the MOSFET, by photolithography so as to reach the diffusion layer 14 or the source or drain regions of the MOSFET. At this time, a first contact hole is also formed in a portion of the first interlayer insulating film 16 on the dicing line region 12 so as to reach the dicing line region 12. The first contact holes are filled with first tungsten 17 by CVD (chemical vapor deposition).

Further, a first aluminum layer 18 is deposited on the overall surface of the structure. The first aluminum layer 18 is patterned into a predetermined shape by photolithography. As a result, a wire made of the first aluminum layer 18 is formed. At the same time, a connecting pattern portion 18A made of the first aluminum layer 18 is formed on the first tungsten 17 buried in the first contact hole on the dicing line region 12. The thickness of the first aluminum layer 18 after the patterning is, for example, about 2300 Å.

Figure 12:
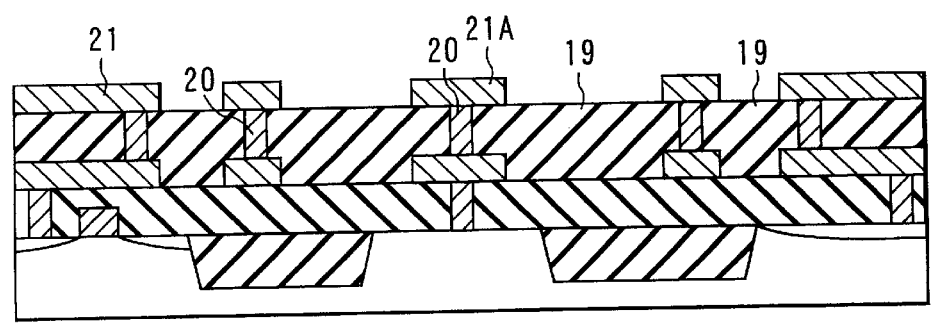

Subsequently, as shown in FIG. 12, a second interlayer insulating film 19 made of $SiO_2$ film is deposited, and flattened by CMP. The thickness of the flattened second interlayer insulating film 19 is, for example, about 4000 Å. Then, second contact holes are formed by photolithography in portions of the second interlayer insulating film 19, corresponding to the wire made of the first aluminum layer 18 and the connecting patter portions 18A, so as to reach the wire made of the first aluminum layer 18 and the connecting patter portions 18A. The second contact holes are filled with second tungsten 20 by CVD.

Further, a second aluminum layer 21 is deposited on the overall surface of the structure. The second aluminum layer 21 is patterned into a predetermined shape by photolithography. As a result, a wire made of the second aluminum layer 21 is formed. At the same time, a connecting pattern portion 21A made of the second aluminum layer 21 is formed on the second tungsten 20 buried in the second contact hole above the dicing line region 12. The thickness of the second aluminum layer 21 after the patterning is, for example, about 3000 Å.

Figure 13:
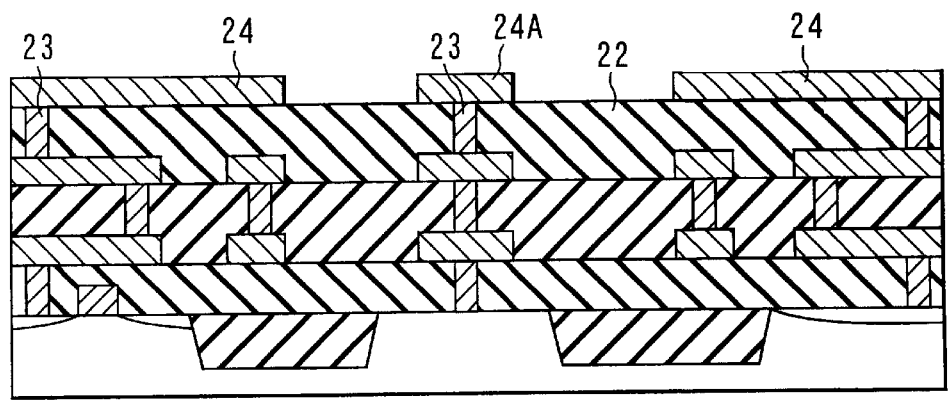

Subsequently, as shown in FIG. 13, a third interlayer insulating film 22 made of $SiO_2$ film is deposited, and flattened by CMP. The thickness of the flattened third interlayer insulating film 22 is, for example, about 4000 Å. Then, third contact holes are formed by photolithography in portions of the third interlayer insulating film 22 corresponding to the wire made of the second aluminum layer 21 and the connecting pattern portion 21A so as to reach the wire made of the first aluminum layer 21 and the connecting pattern portion 21A. The third contact holes are filled with third tungsten 23 by CVD.

Further, a third aluminum layer 24 is deposited on the overall surface of the structure. The third aluminum layer 24 is patterned into a predetermined shape by photolithography. As a result, a wire made of the third aluminum layer 24 is formed. At the same time, a connecting pattern portion 24A is formed on the third tungsten 23 buried in the third contact hole above the dicing line region 12. The thickness of the third aluminum layer 24 after the patterning is, for example, about 3000 Å.

Figure 14:
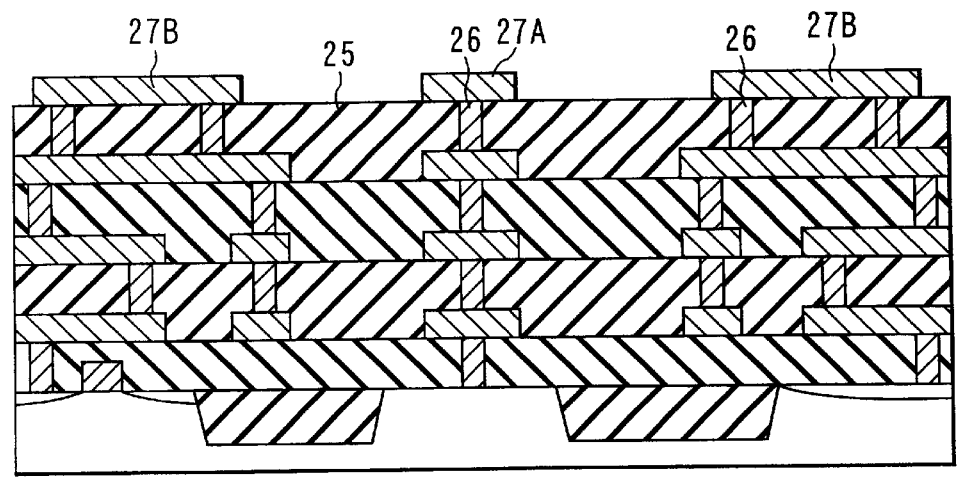

Subsequently, as shown in FIG. 14, a fourth interlayer insulating film 25 made of $SiO_2$ film is deposited, and flattened by CMP. The thickness of the flattened fourth interlayer insulating film 25 is, for example, about 4000 Å. Then, fourth contact holes are formed by photolithography in portions of the fourth interlayer insulating film 25 corresponding to the wire made of the third aluminum layer 24 and the connecting patter portion 24A so as to reach the wire made of the first aluminum layer 24 and the connecting pattern portion 24A. The fourth contact holes are filled with fourth tungsten 26 by CVD.

Further, a fourth aluminum layer is deposited on the overall surface of the structure. The fourth aluminum layer is patterned into a predetermined shape by photolithography. As a result, a metal fuse (not shown) or bonding pads 27B are formed. At the same time, an alignment mark 27A is formed on the fourth tungsten 26 buried in the fourth contact hole above the dicing line region 12. The thickness of the fourth aluminum layer after patterning is, for example, about 5600 Å.

At this stage, the alignment mark 27A is in contact with a conductive plug (fourth tungsten 26) buried in the fourth contact hole in the underlying layer. The alignment mark 27A is electrically connected to the silicon substrate 11 through the plugs and the underlying aluminum patterns (connecting pattern portions), i.e., the fourth tungsten 26, the connecting pattern portion 24A, the third tungsten 23, the connecting pattern portion 21A, the second tungsten 20, the connecting pattern portion 18A and the first tungsten 17.

Figure 15:
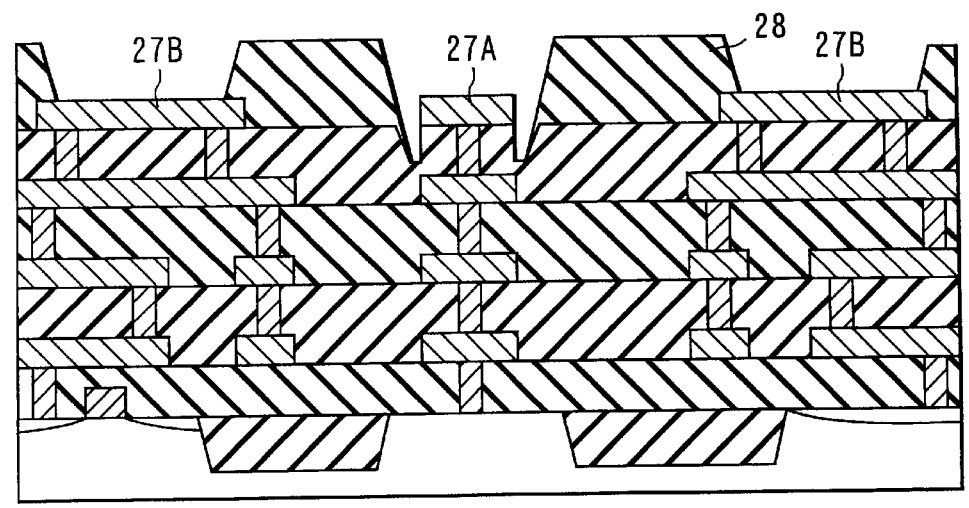
FIG. 15 is a cross-sectional view showing the structure of a semiconductor device according to the first embodiment of the present invention.

Then, as shown in FIG. 15, a passivation film 28 made of $Si_3N_4$ film is deposited. A part of the passivation film 28 on the bonding pad 27B (the fourth aluminum layer) is etched by photolithography, thereby forming an opening through which the bonding pad 27B is exposed. At this time, a part of the passivation film 28 on the alignment mark 27A above the dicing line region 12 is also etched to prevent crack. As a result of this etching process, the alignment mark 27A is exposed and that part of the fourth interlayer insulating film 25 around the alignment mark 27A is over-etched.

In the semiconductor device formed through the manufacturing process as described above, the alignment mark 27A made of the fourth aluminum layer is in contact with the fourth tungsten 26 buried in the fourth contact hole in the underlying layer. Since both the alignment mark 27A and the fourth tungsten 26 are metals, the adhesion therebetween is firmer than that between metal and an interlayer insulating film. Therefore, the alignment mark 27A cannot be removed in the subsequent steps.

In the state shown in FIG. 15, one contact hole and one alignment mark 27 contact to each other. Actually, however, a plurality of contact holes are formed so as to be in contact with the alignment mark 27A. With this structure, the area where the contact holes contact to the alignment mark is increased, resulting in an improvement of adhesion therebetween. The size of the alignment mark is, for example, about 10 $\mu$m×80 $\mu$m. The size of the contact hole is, for example, about 0.185 $\mu$m×0.185 $\mu$m.

As described above, in the semiconductor device (LSI) of the first embodiment, even if the fourth interlayer insulating film 25 under the alignment mark 27A is over-etched, the alignment mark 27A formed of the uppermost metal wire layer is kept in contact with the metal plug buried in the contact hole in the underlying layer. Since the adhesion between the alignment mark 27A and the metal plug buried in the contact hole is firm, the alignment mark 27A is not removed in the subsequent steps. Moreover, since the alignment mark 27A is electrically connected to the silicon substrate, it is prevented from being charged-up and extraordinarily etched.

Therefore, the alignment mark 27A for positioning the laser can be always detected when fuse-blow is to be performed, and there is no problem that fuse-blow cannot be carried out.

Second Embodiment

A method for manufacturing a semiconductor device according to a second embodiment of the present invention will now be described.

In the second embodiment, a bump electrode forming step is performed after the alignment mark 27A of the first embodiment is formed.

FIGS. 10 to 17 are cross-sectional views showing a semiconductor device (LSI) having an alignment mark according to the second embodiment. The semiconductor device has a four-layer metal wiring structure.

Figure 16:
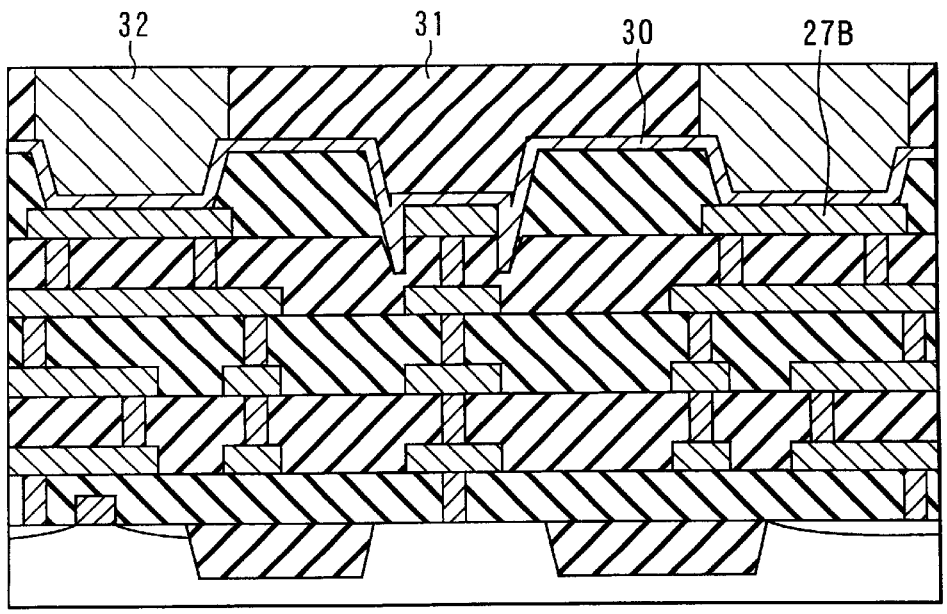
FIG. 16 is a cross-sectional view showing a process for manufacturing a semiconductor device according to a second embodiment of the present invention.

After the process shown in FIGS. 10 to 15 as described above in connection with the first embodiment, a barrier metal 30 made of a Ti/Ni/Pd laminated film is deposited, as shown in FIG. 16. Further, photoresist 31 is applied to the overall surface, and thereafter opened to expose that portion of the barrier metal 30 on the bonding pad 27B on which a bump is to be formed. Then, an Au bump 32 is grown on the portion of the barrier metal 30 on the bonding pad 27B by electrolytic plating or the like.

Figure 17:
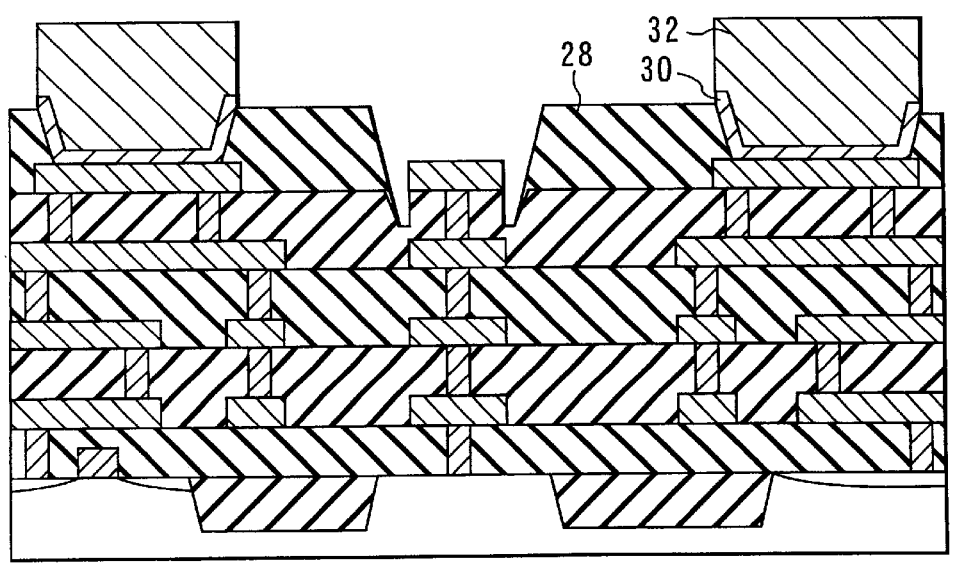
FIG. 17 is a cross-sectional view showing the structure of a semiconductor device according to the second embodiment of the present invention.
Figure 18:
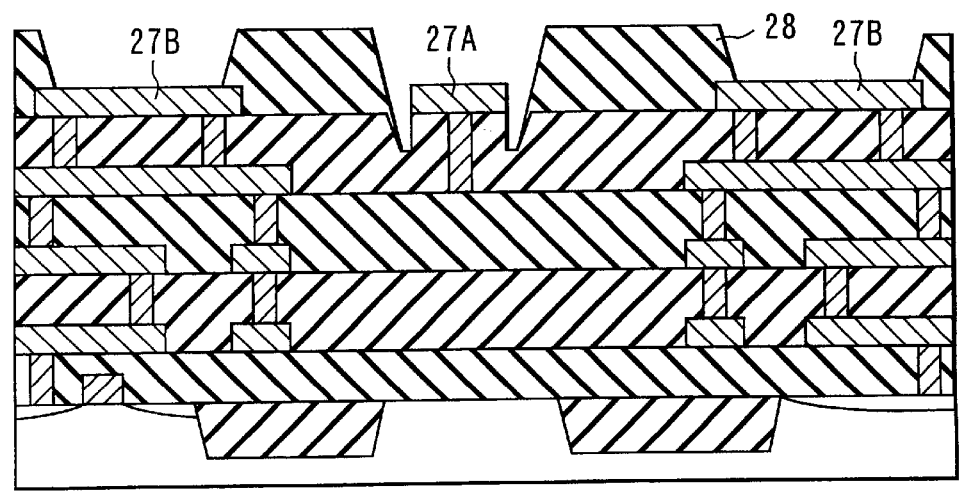
FIG. 18 is a cross-sectional view showing the structure of a semiconductor device according to a third embodiment of the present invention.

Thereafter, as shown in FIG. 17, the photoresist 31 is removed. Then, the barrier metal 30 exposed on the passivation film 28 is removed by a solution of aqua regia, ethylene-diamine-tetraacetic acid, or the like. The Au bump 32 is maintained.

In the semiconductor device manufactured through the process described above, the alignment mark 27 is electrically in contact with the silicon substrate 11 (grounded) through the conductive plugs buried in the contact holes and the aluminum wires (wire connecting pattern portions) in the underling layers.

With the above structure, the alignment mark 27A is prevented from being charged-up in the step of electrolytic plating or the like. Therefore, when the barrier metal 30 exposed on the passivation film 28 is removed by solution of aqua regia, ethylene-diamine-tetraacetic acid, or the like, the alignment mark made of aluminum under the barrier metal 30 cannot be etched. Thus, the alignment mark is prevented from being etched as if it were corroded.

As described above, in the LSI of the second embodiment, the alignment mark 27 is electrically in contact with the silicon substrate 11 (grounded) through the conductive plugs buried in the contact holes and the aluminum wires (wire connecting pattern portions) in the underling layers. This structure prevents the alignment mark 27A from being etched as if it were corroded due to the charge-up in the bump forming step.

Therefore, the alignment mark 27A for positioning the laser can be always detected when fuse-blow is to be performed, and there is no problem that fuse-blow cannot be carried out.

Third Embodiment

The third embodiment is different from the first embodiment in the following respects. No connecting pattern portions and no contact holes are formed in the first to third interlayer insulating films above the dicing line region 12. A contact hole is formed only in the fourth interlayer insulating film 25. An alignment mark 27A is formed on the fourth tungsten 26 buried in the contact hole. The other structure is the same as that of the first embodiment.

In the semiconductor device in this embodiment as described above, the alignment mark 27A made of the fourth aluminum layer is in contact with the fourth tungsten 26 buried in the fourth contact hole in the underlying layer. Since both the alignment mark 27A and the fourth tungsten 26 are metals, the adhesion therebetween is firmer than that between metal and an interlayer insulating film. Therefore, the alignment mark 27A cannot be removed in the subsequent steps.

In the state shown in FIG. 15, one contact hole and one alignment mark 27 contact to each other. Actually, however, a plurality of contact holes are formed so as to be in contact with the alignment mark 27A. With this structure, the area where the contact holes contact to the alignment mark is increased, resulting in an improvement of adhesion therebetween. The size of the alignment mark is, for example, about 10 $\mu$m×80 $\mu$m. The size of the contact hole is, for example, about 0.185 $\mu$m×0.185 $\mu$m.

As described above, in the semiconductor device (LSI) of the third embodiment, even if the fourth interlayer insulating film 25 under the alignment mark 27A is over-etched, the alignment mark 27A formed of the uppermost metal wire layer is kept in contact with the metal plug buried in the contact hole in the underlying layer. Since the adhesion between the alignment mark 27A and the metal plug buried in the contact hole is firm, the alignment mark 27A is not removed in the subsequent steps.

Therefore, the alignment mark 27A for positioning the laser can be always detected when fuse-blow is to be performed, and there is no problem that fuse-blow cannot be carried out.

As has been described above, according to the semiconductor device of the present invention, even if the alignment mark is exposed and an insulating film around the alignment mark is over-etched in a pad opening step, the alignment mark can be prevented from being removed in the subsequent steps and the alignment mark can be detected in fuse-blow.

Further, according to the semiconductor device of the present invention, an alignment mark under a barrier metal is prevented from being etched, when the barrier metal exposed in a region other than a bump electrode region is removed by a solution, and the alignment mark for positioning can be detected in fuse-blow.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate;

an insulating film formed on the semiconductor substrate;

a conductive plug buried in a contact hole formed in the insulating film;

an alignment mark made of a conductive material and formed on the insulating film including the conductive plug, the alignment mark being in contact with the conductive plug;

a wire formed in a layer including the alignment mark; and a passivation film formed on the wire, a portion of the passivation film corresponding to the alignment mark having been removed.

2. A semiconductor device according to claim 1, further comprising a bonding pad formed in the layer including the alignment mark, wherein a portion of the passivation film corresponding to the bonding pad has been removed.

3. A semiconductor device comprising:

a semiconductor substrate;

an insulating film formed on the semiconductor substrate;

a conductive plug buried in a contact hole formed in the insulating film; and an alignment mark made of a conductive material and formed on the insulating film including the conductive plug, the alignment mark being in contact with the conductive plug, the alignment mark being formed above a dicing line region between semiconductor chips.

4. A semiconductor device having a multilayer wire in which a plurality of wires are formed on a semiconductor substrate in layers with insulating films interposed therebetween, said device comprising:

an alignment mark made of a conductive material and formed in a layer including an uppermost wire of the multilayer wire; and a conductive plug buried in a contact hole formed in one of the insulating films under the alignment mark, the conductive plug being in contact with the alignment mark.

5. A semiconductor device according to claim 4, wherein the alignment mark and the conductive plug are made of metal.

6. A semiconductor device according to claim 4, further comprising a passivation film formed on the layer including the uppermost wire, wherein a portion of the passivation film corresponding to the alignment mark has been removed.

7. A semiconductor device according to claim 6, further comprising a bonding pad formed in the layer including the uppermost wire, wherein a portion of the passivation film corresponding to the bonding pad has been removed.

8. A semiconductor device according to claim 7, further comprising a bump formed on the bonding pad.

9. A semiconductor device according to claim 4, wherein the alignment mark is formed above a dicing line region between semiconductor chips.

10. A semiconductor device according to claim 4, wherein the alignment mark is a pattern for use in positioning in a process of manufacturing the semiconductor device.

11. A semiconductor device having a multilayer wire in which a plurality of wires are formed on a semiconductor substrate in layers with insulating films interposed therebetween, said device comprising:

an alignment mark made of a conductive material and formed in a layer including an uppermost wire of the multilayer wire;

a plurality of conductive patterns formed in layers other than the layer including the uppermost wire of the multilayer wire; and a plurality of conductive plugs, respectively buried in contact holes formed in the insulating films under the alignment mark, a conductive plug buried in a contact hole formed in an insulating film immediately under the alignment mark being in contact with the alignment mark, the alignment mark being electrically connected to the semiconductor substrate through said plurality of conductive plugs and said plurality of conductive patterns.

12. A semiconductor device according to claim 11, wherein the alignment mark and the conductive plugs are made of metal.

13. A semiconductor device according to claim 11, further comprising a passivation film formed on the layer including the uppermost wire, wherein a portion of the passivation film corresponding to the alignment mark has been removed.

14. A semiconductor device according to claim 13, further comprising a bonding pad formed in the layer including the uppermost wire, wherein a portion of the passivation film corresponding to the bonding pad has been removed.

15. A semiconductor device according to claim 14, further comprising a bump formed on the bonding pad.

16. A semiconductor device according to claim 11, wherein the alignment mark is formed above a dicing line region between semiconductor chips.

17. A semiconductor device according to claim 11, wherein the alignment mark is a pattern for use in positioning in a process of manufacturing the semiconductor device.

* * * * *